United States Patent
Kang

(10) Patent No.: US 7,965,109 B2
(45) Date of Patent: Jun. 21, 2011

(54) LEVEL DETECTOR FOR A SEMICONDUCTOR MEMORY APPARATUS

(75) Inventor: Dong-Keum Kang, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 11/647,481

(22) Filed: Dec. 29, 2006

(65) Prior Publication Data

US 2007/0200600 A1    Aug. 30, 2007

(30) Foreign Application Priority Data

Feb. 27, 2006  (KR) .................. 10-2006-0018675

(51) Int. Cl.
*H03D 1/00*   (2006.01)
*H03K 5/00*   (2006.01)

(52) U.S. Cl. .......................................... 327/50; 327/333

(58) Field of Classification Search .......... 327/50, 327/51, 52, 63, 65, 68, 74, 75, 77, 333, 538, 327/543, 561, 562, 563
See application file for complete search history.

(56) References Cited

U.S. PATENT DOCUMENTS

| | | | |
|---|---|---|---|
| 5,798,637 A | 8/1998 | Kim et al. | |
| 6,137,335 A | 10/2000 | Proebsting | |
| 6,281,742 B1 | 8/2001 | Sung | |
| 6,323,721 B1 | 11/2001 | Proebsting | |
| 7,551,017 B2* | 6/2009 | Felder | 327/333 |
| 2004/0027194 A1* | 2/2004 | Morishita et al. | 327/543 |
| 2005/0104566 A1* | 5/2005 | Kim | 323/226 |

FOREIGN PATENT DOCUMENTS

| | | |
|---|---|---|
| JP | 4-94566 | 3/1992 |
| JP | 6-259964 | 9/1994 |
| JP | 7-296587 | 11/1995 |
| JP | 10-199249 | 7/1998 |
| KP | 1997-0003862 | 1/1997 |
| KP | 1997-0072695 | 11/1997 |
| KP | 2002-0069279 | 8/2002 |
| KR | 10-0498505 | 6/2005 |

* cited by examiner

*Primary Examiner* — Lincoln Donovan
*Assistant Examiner* — Diana J Cheng
(74) *Attorney, Agent, or Firm* — Venable LLP; Jeffri A. Kaminski; Leigh D. Thelen

(57) ABSTRACT

A bulk voltage (VBB) level sensor for a semiconductor memory apparatus is disclosed. The VBB level detector includes a reference voltage generator for generating a first reference voltage of which level varies with temperature, a reference voltage comparator for receiving a second reference voltage and the first reference voltage to generate a third reference voltage, a bias generator for receiving the third reference voltage to generate a specific bias level, and a VBB sensor for receiving the bias level to detect VBB level.

14 Claims, 5 Drawing Sheets

LEVEL DETECTOR FOR A SEMICONDUCTOR MEMORY APPARATUS

CROSS-REFERENCE TO RELATED PATENT APPLICATION

This application claims the benefit of Korean Patent Application No. 10-2006-0018675, filed on Feb. 27, 2006, in the Korean Intellectual Property Office, the disclosure of which is incorporated herein in its entirety by reference

FIELD OF THE INVENTION

1. Technical Field

The present invention relates to a bulk voltage level detector for a semiconductor memory apparatus and, more particularly, to a bulk voltage level detector for a semiconductor memory apparatus, which is capable of compensating for a threshold voltage with respect to temperature.

2. Related Art

In general, a transistor is characterized by a threshold voltage Vt that is elevated at a temperature lower than a normal temperature and dropped at a temperature higher than the normal temperature.

A bulk voltage (hereinafter, VBB), which refers to a voltage applied to a substrate (i.e., bulk) where the transistor is formed, normally has a negative electric potential. The VBB is generated by a VBB pumping circuit and typically has a negative electric potential lower than a ground voltage VSS. Also, the VBB is used as a power supply voltage for a memory cell and sense amplifier S/A of a core circuit.

A conventional VBB level detector for a semiconductor memory apparatus includes a bias generator 100 and a VBB sensor 200 as illustrated in FIG. 1. The bias generator 100 receives a reference voltage VREFB and generates a specific bias level, and the VBB sensor 200 senses a VBB level.

The reference voltage VREFB is maintained at a constant level with respect to temperature and an external power supply voltage VDD as illustrated in FIG. 2. Also, the bias generator 100 generates a specific bias level in response to the reference voltage VREFB.

The VBB sensor 200 operates to sense a specific VBB level. In this case, the VBB sensor 200 is dependent on the reference voltage VREFB that leads to generation of the bias level, as illustrated in FIG. 2.

At present, a VBB sensing level is controlled by adjusting a level of the reference voltage VREFB or the number of transistors of the VBB sensor 200.

However, since the conventional VBB level detector is designed such that the VBB sensing level is controlled irrespective of temperature, when the semiconductor memory apparatus is driven in a low-temperature place, threshold voltages Vt of transistors constituting a memory cell and sense amplifier S/A are elevated. It may result in the degradation of various characteristics, including a write recovery time (tWR) characteristic, as compared with the case where the semiconductor memory apparatus is driven at a normal temperature.

SUMMARY OF THE INVENTION

An embodiment of the present invention provides a VBB level detector for a semiconductor memory apparatus, which is capable of maintaining a stable threshold voltage although a temperature is changed.

An embodiment of the present invention provides a VBB level detector for a semiconductor memory apparatus, comprising: a reference voltage generator for generating a first reference voltage of which level varies with temperature; a reference voltage comparator for receiving a second reference voltage and the first reference voltage to generate a third reference voltage; a bias generator for receiving the third reference voltage to generate a specific bias level; and a VBB sensor for receiving the bias level to sense VBB level.

The first reference voltage may vary with temperature, while the second reference voltage may be maintained at a constant level irrespective of temperature. The reference voltage comparator may compare the first reference voltage with the second power supply voltage and outputs a lower-level signal to generate the third reference voltage.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EXEMPLARY EMBODIMENT

Figure 1:
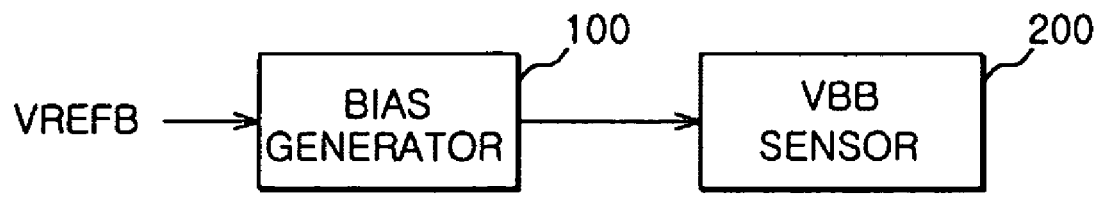
FIG. 1 is a block diagram of a conventional VBB level detector.
Figure 2:
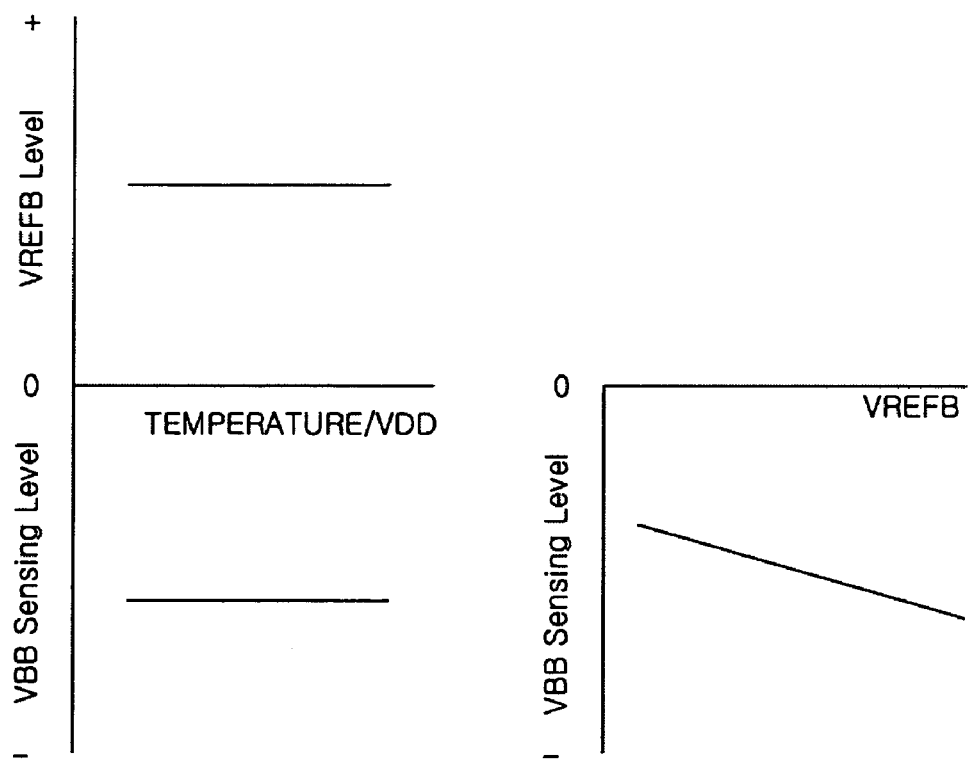
FIG. 2 is a waveform diagram showing the characteristics of the VBB level detector shown in FIG. 1.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Hereinafter, an exemplary embodiment of the present invention is described in conjunction with the accompanying drawings.

Figure 3:
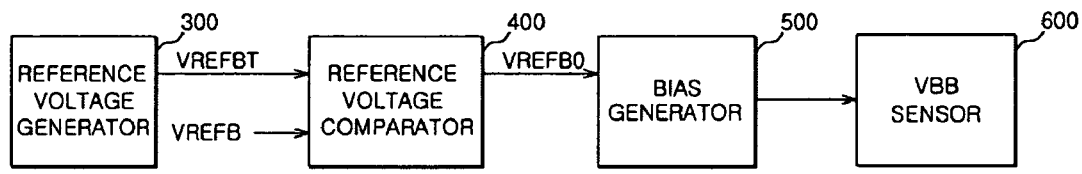
FIG. 3 is a block diagram of a VBB level detector of a semiconductor memory apparatus according to an embodiment of the present invention.
Figure 4:
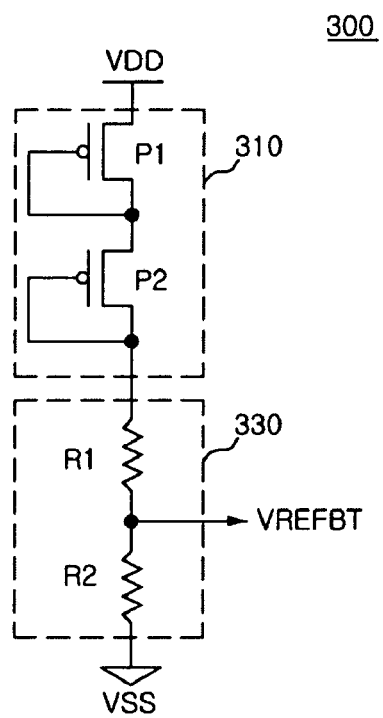
FIG. 4 is a circuit diagram of a reference voltage generator shown in FIG. 3.

Referring to FIG. 3, a VBB level detector for a semiconductor memory apparatus may include a reference voltage generator 300, a reference voltage comparator 400, a bias generator 500, and a VBB sensor 600.

The reference voltage generator 300 generates a first reference voltage VREFBT of which level varies according to a temperature. The reference voltage generator 300 includes a diode circuit unit 310 and a level control circuit unit 330. The diode circuit unit 310 varies the amount of current according to the temperature. The level control circuit 330 controls an output level of the first reference voltage VREFBT.

The diode circuit unit 310 includes a first PMOS transistor P1 and a second PMOS transistor P2. The first PMOS transistor P1 has a source connected to an external power supply voltage VDD and a gate and a drain that are connected in common. The second PMOS transistor P2 has a source connected the drain of the first PMOS transistor P1 and a gate and a drain that are connected in common.

The level control circuit unit 330 includes a first resistor R1 and a second resistor R2. The first resistor R1 is connected between the drain of the second PMOS transistor P2 and a common node, while the second resistor R2 is connected between the common node and a ground voltage terminal VSS. The level control circuit unit 330 outputs the first reference voltage VREFBT from the common node.

The diode circuit unit 310 includes two diode-type transistors, namely, the PMOS transistors P1 and P2, to control the amount of current flowing from the external power supply voltage VDD to the level control circuit unit 330 according to the temperature. The number of PMOS transistors included in the diode circuit unit 310 may be changed in other embodiments.

Also, the number of resistors included in the level control circuit unit 330 may be changed to control the level of the first reference voltage VREFBT output from the common node.

In the reference voltage generator 300, the diode-type first and second PMOS transistors P1 and P2 included in the diode circuit unit 310 have different current-sink capabilities according to the temperature. Thus, threshold voltages Vt of the first and second PMOS transistors P1 and P2 falls at a high temperature, so that the amount of current supplied to the level control circuit unit 330 increases. In contrast, the threshold voltages Vt of the first and second PMOS transistors P1 and P2 increases at a low temperature, so that the amount of current supplied to the level control circuit unit 330 decreases.

The level control circuit unit 330 controls the level of a voltage output from the common node between the first and second resistors R1 and R2 (i.e., the level of the first reference voltage VREFBT) according to the amount of the supplied current. When the temperature is higher than the normal temperature (i.e., room temperature), the level control unit 330 outputs the first reference voltage VREFBT at a high level. In other words, the level of the first reference voltage VREFBT may vary with temperature.

Figure 5:
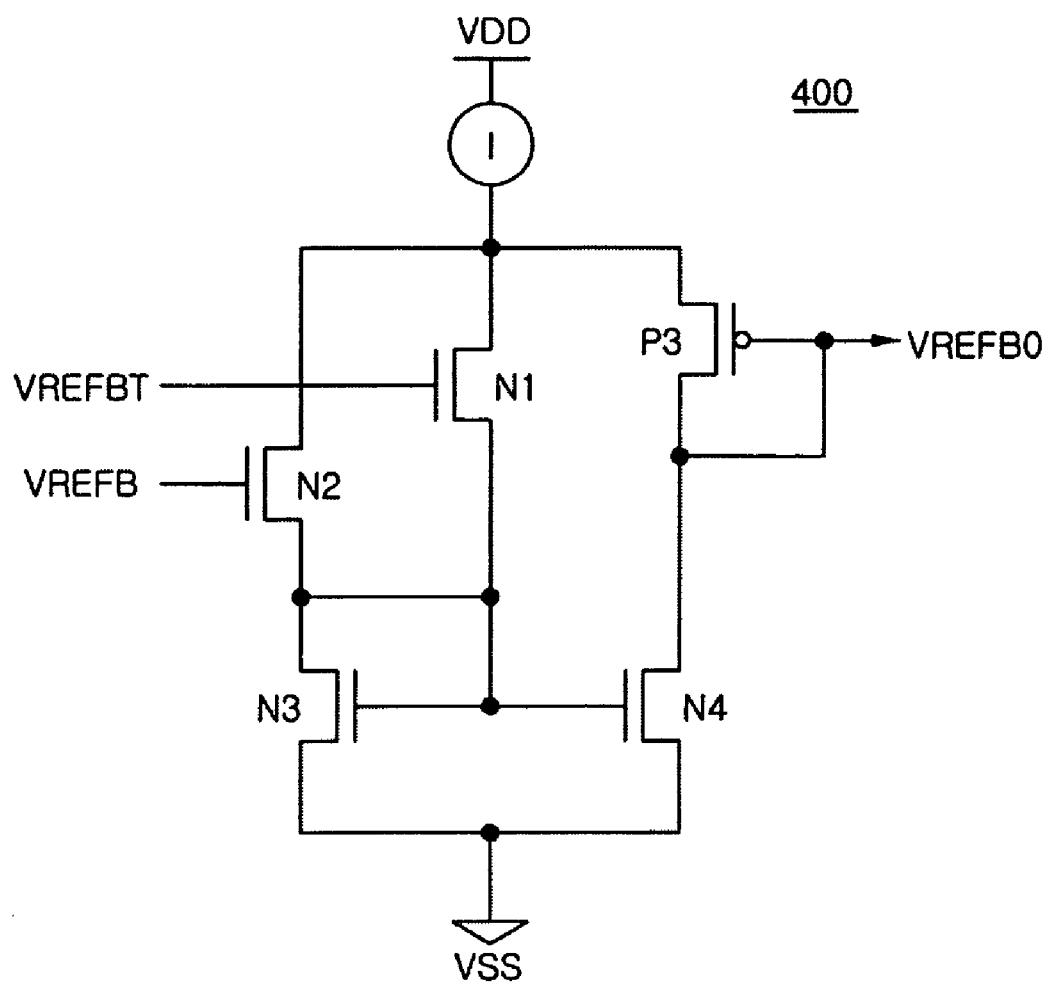
FIG. 5 is a circuit diagram of a reference voltage comparator shown in FIG. 3.

Referring to FIG. 5, the reference voltage comparator 400 receives the first reference voltage VREFBT and a second reference voltage VREFB and outputs a third reference voltage VREFB0, which is a signal to be compared with the first and second reference voltages VRREFBT and VRERB. The reference voltage comparator 400 may include a first NMOS transistor N1, a second NMOS transistor N2, a third NMOS transistor N3, a third PMOS transistor P3, and a fourth NMOS transistor N4.

The first NMOS transistor N1 has a drain connected to a constant current generator connected to the external power supply voltage VDD and a gate receiving the first reference voltage VREFBT. The second NMOS transistor N2 has a drain connected to the constant current generator, a gate receiving the second reference voltage VREFB, and a source connected to the source of the first NMOS transistor N1. The third NMOS transistor N3 has a drain and a gate, both connected to the source of the second NMOS transistor N2, and a source connected to the ground voltage terminal VSS. The third PMOS transistor P3 has a source connected to the constant current generator and a drain and a gate, which are connected in common. This third PMOS transistor P3 outputs the third reference voltage VREFB0. The fourth NMOS transistor N3 has a gate connected to the gate of the third NMOS transistor N3, a source connected to the ground voltage terminal VSS, and a drain connected to the drain of the third PMOS transistor P3.

In this case, the first reference voltage VREFBT, which is applied to the reference voltage comparator 400, varies at a slope angle with respect to temperature, while the second reference voltage VREFB, which is also applied to the reference voltage comparator 400, is maintained at a constant level irrespective of changes in temperature. When the level of the second reference voltage VREFB is a higher than that of the first reference voltage VREFBT, the first NMOS transistor N1, to which the first reference voltage VREFBT is applied, becomes inferior in driving capability to the second NMOS transistor N2, to which the second reference voltage VREFB is applied. As a result, the second NMOS transistor N2 is turned on, providing voltage to drive the third and fourth NMOS transistors N3 and N4. Also, the third reference voltage VREFB0 outputs a voltage that varies at a slope angle with respect to temperature from the gate (or drain) of the diode-type third PMOS transistor P3.

On the other hand, when a level of the first reference voltage VREFBT is a higher than that of the second reference voltage VREFB, the first NMOS transistor N1, to which the first reference voltage VREFBT is applied, becomes superior in driving capability to the second NMOS transistor N2, to which the second reference voltage VREFB is applied. As a result, the first NMOS transistor N1 is turned on, providing voltage to drive the first NMOS transistor N1. Also, the third reference voltage VREFB0 outputs a voltage, which remains at a constant level irrespective of temperature, from the diode-type third PMOS transistor P3.

Figure 6:
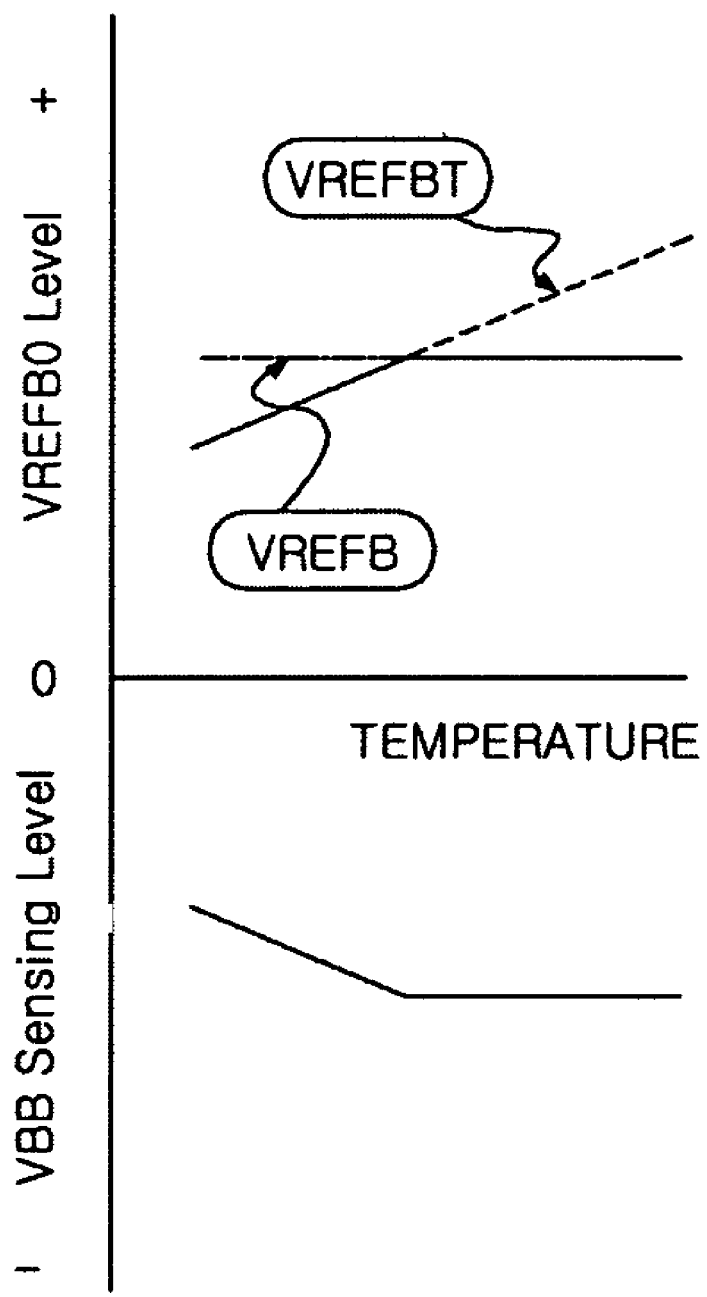
FIG. 6 is a waveform diagram showing the characteristic of the VBB level detector shown in FIG. 3.

Referring to FIG. 6, the third reference voltage VREFB0, which applies a voltage to the VBB sensor 600 through the bias generator 500, varies with temperature to a certain level and holds at a constant value irrespective of temperature beyond that level.

Furthermore, since the VBB sensor 600 is dependent on the third reference voltage VREFB0, it also varies with temperature as far as a certain level. Thus, the VBB sensor 600 controls a VBB sensing level at a low temperature, while it maintains the VBB sensing level irrespective of temperature beyond that certain level.

Based on the above-described characteristic of the VBB sensor 600, a VBB level is variable to temperature as far as a certain temperature, while it remains constant over the certain temperature. Therefore, threshold voltage of a transistor with respect to temperature is compensated for, thus improving the degradation of characteristics caused by a rise in threshold voltage at a low temperature.

According to embodiments of the present invention described above, the VBB level detector for the semiconductor memory apparatus can prevent its characteristics from deteriorating due to a rise in threshold voltage of a transistor at a low temperature, so as to improve the operating characteristics of a memory cell and sense amplifier.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A VBB (bulk voltage) level detector for a semiconductor memory apparatus, comprising:
   a reference voltage generator configured to generate and output a first reference voltage that varies with temperature;
   a reference voltage comparator configured to compare the first reference voltage with a second reference voltage, to generate a third reference voltage having a compensated level based on a certain temperature;
   a bias generator configured to receive the third reference voltage, to generate a specific bias level; and
   a VBB sensor configured to receive the bias level to sense VBB level, wherein the reference voltage comparator comprises:
   a first NMOS transistor having a drain connected to a constant current generator, a gate configured to receive the first reference voltage, and a source;
   a second NMOS transistor having a drain connected to the constant current generator, a gate configured to receive the second reference voltage, and a source terminal connected to the source of the first NMOS transistor;
   a third NMOS transistor having a drain and a gate connected in common to the source of the first and the second NMOS transistor and a source connected to a ground voltage terminal;
   a third PMOS transistor having a source connected to the constant current generator and a drain and a gate connected in common to output the third reference voltage; and
   a fourth NMOS transistor having a gate connected to the gate of the third NMOS transistor, a source connected to the ground voltage terminal, and a drain connected to the drain of the third PMOS transistor,
   wherein the constant current generator is connected to an external power supply voltage.

2. The VBB level detector as set forth in claim 1, wherein the reference voltage generator comprises:
   a diode circuit unit configured to vary the amount of current according to temperature; and
   a level control circuit unit configured to control the output level of the first reference voltage.

3. The VBB level detector as set forth in claim 2, wherein the diode circuit unit comprises:
   a first PMOS transistor having a source connected to an external power supply voltage and a gate and a drain that are connected in common; and
   a second PMOS transistor having a source connected to the drain of the first PMOS transistor and a gate and a drain that are connected in common.

4. The VBB level detector as set forth in claim 3, wherein the level control circuit unit comprises:
   a first resistor; and
   a second resistor connected to a ground voltage terminal at one end and connected to the first resistor at a common node at the other end,
   wherein the level control circuit unit outputs the first reference voltage from the common node.

5. The VBB level detector as set forth in claim 4, wherein the first resistor is connected to the drain of the second PMOS transistor of the diode circuit unit.

6. The VBB level detector as set forth in claim 1, wherein the reference voltage comparator is configured to compare a level of the first reference voltage with a level of the second reference voltage and output a lower-level signal as the third reference voltage.

7. A VBB level detector for a semiconductor memory apparatus, comprising:
   a bias generating circuit configured to generate a constant bias level both in a high temperature period lower than a level of a room temperature range and in a low temperature period higher than the level of the room temperature range and to generate a bias level variable to temperature at the room temperature range; and
   a VBB sensing circuit unit having an input configured to receive the bias level output of the bias generator, the VBB sensing circuit unit being configured to sense a compensated VBB level in response to the bias level of the bias generating circuit,
   wherein the certain level is a period with a predetermined temperature range and, wherein the bias generating circuit includes a reference voltage comparator comprising:
   a first NMOS transistor having a drain connected to a constant current generator, a gate terminal connected to the first reference voltage, and a source;
   a second NMOS transistor having a drain connected to the constant current generator, a gate connected to the second reference voltage, and a source connected to the source of the first NMOS transistor;
   a third NMOS transistor having a drain and a gate connected in common to the source of the first and the second NMOS transistor and a source connected to a ground voltage terminal;
   a third PMOS transistor having a source connected to the constant current generator and a drain and a gate connected in common to output the third reference voltage; and
   a fourth NMOS transistor having a gate connected to the gate of the third NMOS transistor, a source connected to the ground voltage terminal, and a drain connected to the drain terminal of the third PMOS transistor,
   wherein the constant current generator is connected to an external power supply voltage.

8. The VBB level detector as set forth in claim 7, wherein the bias generating circuit is configured to generate the bias level in response to a third reference voltage obtained by a difference between a first reference voltage and a second reference voltage,
   wherein the first reference voltage varies with temperature and the second reference voltage is constant irrespective of temperature.

9. The VBB level detector as set forth in claim 8, wherein the bias generating circuit includes further comprising a reference voltage generator configured to generate the first reference voltage.

10. The VBB level detector as set forth in claim 9, wherein the reference voltage generator comprises:
    a diode circuit unit configured to vary the amount of current according to temperature; and
    a level control circuit unit configured to control an output level of the first reference voltage.

11. The VBB level detector as set forth in claim 10, wherein the diode circuit unit comprises:
    a first PMOS transistor having a source connected to an external power supply voltage and a gate and a drain that are connected in common; and
    a second PMOS transistor having a source connected to the drain of the first PMOS transistor and a gate and a drain that are connected in common.

12. The VBB level detector as set forth in claim 11, wherein the level control circuit unit comprises:
   a first resistor; and
   a second resistor connected to a ground voltage terminal at one end and connected to the first resistor at a common node at the other end,
   wherein the level control circuit unit outputs the first reference voltage from the common node.

13. The VBB level detector as set forth in claim 12, wherein the first resistor is connected to the drain of the second PMOS transistor of the diode circuit unit.

14. The VBB level detector as set forth in claim 8, wherein the reference voltage comparator is configured to generate the third reference voltage, wherein the reference voltage comparator is configured to compare a level of the first reference voltage with a level of the second reference voltage and output a lower-level signal as the third reference voltage.

* * * * *